United States Patent [19]

Hochheimer et al.

[11] Patent Number: 5,492,653
[45] Date of Patent: Feb. 20, 1996

[54] AQUEOUS SILVER COMPOSITION

[75] Inventors: John T. Hochheimer, Downingtown, Pa.; Jerry I. Steinberg, Wilmingtown, Del.; Michael S. Skrzat, Harleysville, Pa.

[73] Assignee: Heraeus Incorporated, West Conshohocken, Pa.

[21] Appl. No.: 335,146

[22] Filed: Nov. 7, 1994

[51] Int. Cl.$^6$ .............. H01H 1/22; B05D 1/02; B05D 5/12; C09D 5/24
[52] U.S. Cl. ............ 252/514; 106/1.14; 106/1.19; 427/125; 501/19; 501/20
[58] Field of Search ............ 252/514; 106/1.14, 106/1.19, 1.23; 427/125; 501/17, 19, 20

[56] References Cited

U.S. PATENT DOCUMENTS

| | | | |
|---|---|---|---|
| 3,201,223 | 8/1965 | Cuhra et al. | 75/370 |
| 3,305,369 | 2/1967 | Cuhra et al. | 106/1 |
| 4,032,350 | 6/1977 | Greenstein | 252/514 X |
| 4,331,714 | 5/1982 | Tyran | 252/514 X |
| 4,715,989 | 12/1987 | Sullivan et al. | 252/512 |
| 4,826,631 | 5/1989 | Sullivan | 252/512 |
| 4,851,051 | 7/1989 | Bushey | 134/2 |
| 4,906,596 | 3/1990 | Joslin et al. | 501/17 |
| 4,950,423 | 8/1990 | Sullivan | 252/512 |
| 5,062,891 | 11/1991 | Gruber et al. | 106/20 |
| 5,174,925 | 12/1992 | Fujii et al. | 252/514 |
| 5,242,623 | 9/1993 | Morrison, Jr. | 252/512 |
| 5,252,632 | 10/1993 | Savin | 252/514 X |
| 5,286,415 | 2/1994 | Buckley et al. | 252/502 |
| 5,417,745 | 5/1995 | Oprosky et al. | 252/514 X |
| 5,431,718 | 7/1995 | Lombard et al. | 252/514 X |

OTHER PUBLICATIONS

Acrysol® I-2426 Brochure, Rohm and Haas Co., Philadelphia, PA, Sep. 1989.

*Primary Examiner*—Douglas J. McGinty
*Attorney, Agent, or Firm*—Jeffrey C. Lew

[57] ABSTRACT

Coating compositions of silver flake suspended in predominantly aqueous vehicle is disclosed for laying down a coating of electrically conductive metal on resistive or dielectric substrates useful in the electronics industry. The coating compositions provide an ideal combination of high silver loading and low viscosity for spray painting desired thickness coatings at high speed in a single pass. The novel compositions include silver flake, water soluble polymer binder, water and a substantially completely water soluble, organic co-solvent. The coating compositions have good green strength after drying and may be used to apply an electrically conductive base to enable electroplating plastic or elastomer parts. Optional sintering adhesives can be added to allow high temperature, permanent bonding of the silver to a ceramic substrate. The coating compositions have excellent storage stability such that settled solids can be redispersed readily with brief and/or mild agitation.

23 Claims, No Drawings

AQUEOUS SILVER COMPOSITION

FIELD OF THE INVENTION

This invention relates to aqueous metal suspensions suitable for coating electrically conductive metal on resistive or dielectric substrates.

BACKGROUND AND SUMMARY OF THE INVENTION

Electronic parts which include a resistive or dielectric substrate coated with a thin layer of conductive metal find important use in industry. The conductive metal layer is applied to the substrate by spraying, brushing, dipping, rolling or screen printing a coating composition of finely divided, metal particles suspended in a liquid vehicle. Spraying is a preferred method of applying the conductive metal layer because it is fast and it permits laying down uniform, thin layers on very intricately shaped parts. Subsequently, the coating composition is dried at ambient or slightly higher temperature, then the part is fired at very high temperature to permanently bond the metal to the substrate.

Traditionally, the solvent in the liquid vehicle for silver coating compositions has been primarily a volatile organic compound, (VOC). A VOC-based vehicle has several drawbacks. It may be toxic, flammable, and possibly explosive. The VOC raw material is costly to purchase and the waste is expensive to discard. Generally, VOC solvent emitted from coating operations is an environmental air pollutant. Expensive equipment and procedures are required to capture and contain VOC solvent emissions in order to reduce air pollution and enable proper waste disposal.

While it is desirable to have a sprayable, silver coating composition based on an aqueous vehicle, heretofore it has been unknown how to formulate such a composition. Lubricant on the silver is one obstacle to achieving aqueous based coating compositions. Silver flake is usually made by milling lubricated silver powder. The lubricant is very important for assuring that the metal particles form into flakes as a result of the milling. It has been found that residual lubricant on the flake surface can make the flake hydrophobic and difficult to disperse in water. Poorly dispersed silver flake will not spray uniformly, and produces an irregular coating on the substrate. Furthermore, it is common in the industry to use very small hole spray nozzles. Poorly dispersed silver coating composition can frequently clog small hole nozzles. It is also desirable to have a very high concentration of silver particles in the composition in order to lay down at high speed a specified coating thickness in the least number of spraying applications, and preferably only one application. However, if silver particle concentration is too high, the coating composition viscosity rises excessively and adversely affects spraying performance. High silver concentration also increases the tendency of the silver to settle and irreversibly agglomerate. Prior to this invention, a low viscosity, highly silver-loaded, sprayable coating composition based on an aqueous vehicle was unavailable.

Accordingly, it is a main objective of this invention to provide for the safe, environmentally benign production of silver-coated, ceramic parts. It is a feature of this invention that a silver coating composition contains an aqueous liquid vehicle which is substantially free of volatile organic compounds. The present invention advantageously allows a silver coating composition to be coated on ceramic parts without the need to recover and safely dispose of large quantities of volatile organic compounds.

It is another objective of the present invention to provide a silver coating composition that can be applied using conventional coating equipment and without changing existing manufacturing procedures significantly. It is an advantage of this invention that well-dispersed, aqueous coating compositions based on lubricated silver flake can be formulated. It is a feature of this invention that the coating compositions have an optimum combination of low viscosity and very high loading of silver flake. Therefore it is another advantage of the present invention that silver coating compositions can be applied in only a single, high speed spray application using existing, small hole, spray nozzles to provide a very uniform, firmly attached, metal coating.

It is still another objective of the present invention to provide a stable coating composition in which the silver flake resists separation from the liquid vehicle on standing in storage. The present invention includes a combination of ingredients which promotes and maintains uniform dispersion of the silver in the aqueous-based vehicle. It is an additional feature of this invention that any solids which settle can be readily redispersed in the vehicle with minimum agitation.

Accordingly, there is presently provided a coating composition comprising:

(a) about 30 to about 80 wt % silver flake coated with a lubricant comprising at least one straight-chain organic acid or salt of said acid, said lubricant having from 6 to 18 carbon atoms;

(b) about 1.5 to about 4.0 wt % substantially completely water soluble polymer binder;

(c) about 0.5 to about 8.0 wt % substantially completely water soluble co-solvent; and (d) a solvent effective amount of water;

wherein said percentages are based on total weight of the coating composition.

There is also provided a process of coating a resistive or dielectric substrate with a layer of conductive metal, comprising the steps of:

(1) spraying a coating composition onto said substrate to form a coated part, said coating composition comprising:

(a) about 30 to about 80 wt % silver flake coated with a lubricant comprising at least one straight-chain organic acid or salt of said acid, said lubricant having from 6 to 18 carbon atoms;

(b) about 1.5 to about 4.0 wt % substantially completely water soluble polymer binder;

(c) about 0.5 to about 8.0 wt % substantially completely water soluble co-solvent; and (d) a solvent effective amount of water;

wherein said percentages are based on total weight of the coating composition; and (2) drying said coated part at temperature in the range of about 20° C. to about 200° C. until at least 95% of water in the coating composition is removed.

When it is desired to permanently attach the silver layer to a suitably temperature resistant substrate, such as ceramic, the composition can contain an optional, sintering adhesive component and the coated part can be fired at a temperature from about 600° C. to about 950° C. for a duration sufficient to activate the sintering adhesive. Subsequently, the part is cooled to solidify the sintering adhesive.

DETAILED DESCRIPTION OF THE INVENTION

The invention relates to a sprayable coating composition of silver flake suspended in an aqueous vehicle. The coating composition can be applied by spraying onto a resistive or dielectric substrate followed by removing most of the water in a low temperature drying step at ambient or slightly higher temperature. After low temperature drying the silver flake will be temporarily but firmly adhered to the substrate. In a subsequent, optional process step, the dried part is heated sufficiently to sinter inorganic adhesive components which permanently attach the silver to the substrate.

The silver component is finely divided flake typically produced in a ball mill by bead milling silver powder in the presence of a lubricant. Lubricants that are suitable for use in the present invention include saturated and unsaturated, organic fatty acids and salts, preferably alkaline earth metal salts, of organic fatty acids. These organic fatty acids are straight-chain carboxylic acids, preferably monocarboxylic acids, having from 6 to 18 carbon atoms. Representative saturated organic fatty acids are lauric acid, palmitic acid and stearic acid. Representative unsaturated organic fatty acids are oleic acid, linoleic acid, linolenic acid. Although a single acid or salt can predominate in the lubricant composition, frequently the lubricant comprises a mixture of the acids or salts. The lubricant is charged to the mill as solution in alcohol or mineral spirits. The silver is milled into generally thin flat particles having a thickness in the range from about 0.1 to about 0.5 μm and an average long dimension in the range of about 3 to about 10 μm. Preferably, the long dimension is less than 15 μm. The lamellar shape of flake allows the particles to pack more closely than powder particles and gives the flake a high bulk density. Silver flake suitable for use in this invention has a tap density, i.e., bulk density, greater than about 2.0 g/cm$^3$, and preferably in the range of about 2.5 to about 3.5 g/cm$^3$. In comparison, the tap density of silver powder is roughly about 0.8 to about 1.5 g/cm$^3$. Surface area of silver flake of this invention is about 1.1 to about 1.8 m$^2$/g. The coating composition preferably contains about 60 to about 75 wt % silver flake.

The coating composition preferably contains about 1.7 to about 3.0 wt % of a polymer binder for securing the silver flake to the substrate after the low temperature drying. Preferably the polymer binder is a water-soluble, aqueous emulsion, acrylic polymer. Acrylic polymer means homopolymers or copolymers of monomers which include acrylic acid, methacrylic acid, occasionally referred to collectively as (meth)acrylic acid, $C_1$–$C_{12}$ alkyl esters of (meth)acrylic acid and mixtures of these monomers. Representative acrylic polymers include, poly(methyl methacrylate); poly(stearyl methacrylate); poly(methacrylate); poly(ethylacrylate); and poly(butylacrylate). Comonomers of acrylic copolymers can have styrenic or hydroxyl functionality.

The aqueous emulsion polymer binder can be neutralized to a pH of about 7–12, and preferably about 8–10 with alkali or amine. Neutralization causes the polymer chains to extend so that the emulsion particles absorb water, swell and substantially completely dissolve in the aqueous medium. Incorporation of substantially completely water soluble polymer binder importantly keeps the coating composition viscosity low which is best for spraying. By "substantially completely water soluble" is meant that the solid material dissolves to a sufficient extent to form a single phase mixture with water. It is believed that the carboxylate functionality of the dissolved polymer synergistically helps to disperse silver flake in the aqueous vehicle. Suitable alkali and amine neutralizing agents include ammonium hydroxide, sodium hydroxide, potassium hydroxide, dimethylaminoethanol, monoethanolamine and morpholine. Monoethanolamine is preferred. The polymer binder suitable for use in the present invention has an average molecular weight in the range from about 5,000 to about 80,000, and preferably in the range from 15,000 to about 60,000. Acid number of the polymer binder is at least 60 mg KOH/g polymer. The polymer binder has glass transition temperature, Tg, in the range from about −10° C. to about 80° C., and preferably from about 25° C. to about 60° C. It is also important that the polymer binder of this invention burns off nearly completely during the firing step so that little residue remains to interfere with high temperature sintering. Representative commercially available polymer binders include, Joncryl® 142, from S. C. Johnson Company, an acrylic polymer with molecular weight about 48,000, acid no. about 130 mg KOH/g, and Tg below about 7° C.; Carboset® GA1914, from B. F. Goodrich, an acrylic emulsion polymer with acid no. about 125 and Tg about 35° C.; and Sokalon® CP-45, from BASF, an acrylic/maleic acid copolymer with molecular weight of about 70,000 and acid no. about 210. Acrysol® I-62 (molecular weight 15,000; acid no. 100; and Tg 45° C.), and Acrysol® I-2426, (molecular weight 60,000; acid no. 115 and Tg 54° C.), products of Rohm and Haas Company, Philadelphia, Pa., are particularly effective as the polymer binder. Preneutralized, i.e., solution form, commercial polymer binder, such as Carboset® GA1594, from B. F. Goodrich, an acrylic polymer with Tg about 28° C., an acid no. of 65 mg KOH/g and preneutralized with dimethylaminoethanol is also acceptable.

Water, preferably, deionized water is present in the aqueous vehicle in solvent effective amount. That is, it is the major liquid phase component and is a solvent for polymer binder, co-solvent and any water soluble surfactant and defoamer additives. The aqueous vehicle also contains a minor amount of an organic, substantially completely water soluble co-solvent. The co-solvent has a boiling point higher than that of water. The co-solvent compatibilizes the silver, polymer binder and water system. It increases dispersability of hydrophobic silver flake in the vehicle; it promotes coalescing and film-forming properties of the coating composition; and it optimizes coating composition viscosity. Some co-solvent may remain on the coated part after low temperature drying. Accordingly, the co-solvent should burn cleanly to leave minimal carbonaceous residue after firing. Preferably, the co-solvent is from about 0.8 to about 6.0 wt %, based on the total weight of the coating composition. Lower concentrations of co-solvent are preferred in order to minimize the amount of volatile organic compound in the coating composition. Co-solvents which can be used in the aqueous vehicle include strongly polar, substantially completely water soluble organic solvents having 6 to 18 carbon atoms, including aliphatic alcohols; ethylene and propylene oligomer glycols; ethers and esters of such alcohols and glycols; and mixtures of them. Representative co-solvents include diethyleneglycol monoethylether, diethyleneglycol monobutylether and 2-butoxyethanol. Diethyleneglycol monobutylether is preferred.

The coating composition optionally contains at least one sintering adhesive. A representative sintering adhesive for bonding metal coatings to ceramic substrates includes one or more metal oxides, such as cupric oxide, cadmium oxide, zinc oxide, barium oxide, manganese oxide, aluminum oxide, silicon dioxide, and a modified-borosilicate glass frit with modifiers such as barium and lead. The sintering adhesive will be present in the coating composition preferably from about 0.1 to about 2 wt %, and more preferably from about 0.1 to about 0.5 wt %. Although the coating composition is primarily intended for coating on substrates which will be later fired, it may also serve to deposit thin silver films on dielectric or resistive materials not intended for firing, such as ceramic, quartz, alumina, and plastic or elastomeric polymers. When the coating composition is used to coat articles not intended for firing, sintering adhesive can be excluded from the composition without detriment.

The coating composition normally contains additives selected from among a wide variety of conventional surfactants, defoamers and anti-settling agents. Such additives foster dispersion of the silver flake in the aqueous vehicle. The silver can also settle on standing for long periods. If the silver does not easily redisperse in the solvent with agitation, the composition is said to "settle hard." The coating composition of the present invention settles soft, i.e., settled solids will readily disperse with brief and/or mild agitation. Surfactant and defoamer additives constitute about 0.3 to about 6.0 wt % of the coating composition. A preferred recipe of surfactant and defoamer additives includes from about 0.1 to about 1.6 wt % of the coating composition, more preferably about 0.4 wt %, ammonium salt of polyelectrolyte dispersing agent available from R. T. Vanderbilt Company under the tradename Darvan® C-No. 7; from about 0.1 to about 0.8 wt % of the coating composition, more preferably about 0.2 wt %, of 2,4,7,9-tetramethyl-5-decyn-4,7-diol defoaming, non-ionic surfactant available from Air Products and Chemicals, Inc. under the tradename Surfynol® 104 Surfactant; and from about 0.1 to about 0.8 wt % of the coating composition, more preferably about 0.2 wt %, of modified polysiloxane copolymer defoamer available from BYK-Chemie USA under the tradename BYK®-020. Anti-settling agents useful in the present invention are high surface area, finely divided particulate, inert mineral compounds, such as fumed alumina, fumed titania and fumed silica. Fumed silica with particle size of about 7 to about 12 nm and having a specific surface area of about 200 to about 300 $m^2/g$ is preferred. Anti-settling agent concentration is generally about 0.1 to about 5.0 wt %, preferably about 0.3 to about 1.0 wt % of the coating composition.

The coating composition can be prepared using conventional equipment. Generally, the substantially completely water soluble polymer binder is supplied as about 50 wt % emulsion in water. It is neutralized by adding alkali or amine. Below a certain pH which depends on the type of polymer binder, viscosity of the aqueous vehicle will vary with pH. In order to reduce the sensitivity of viscosity on pH, alkali or amine is added to obtain pH in the range of about 7–12, preferably about 8 to about 10, and more preferably, about 9. Alternatively, commercially available, preneutralized polymer binder, i.e., in which the polymer as supplied is dissolved in an aqueous medium, can be used. Water and co-solvent are added to the neutralized polymer binder to make the aqueous vehicle. It is also possible to dilute the polymer binder emulsion with water and co-solvent and then to neutralize the polymer binder by adding alkali or amine to the dilute emulsion.

Significantly, the polymer binder is present in the coating composition in the dissolved state prior to spraying. This is different from conventional paint technology in which a coalescing agent activates a pigment binder after the solvent has begun to evaporate. While not wishing to be bound by a particular theory, it is believed that the coating compositions of this invention have adequate "green strength" in large part because the polymer binder is dissolved before the solvent begins to evaporate. The term "green strength" as used herein means the adhesive strength of the silver to the surface of the low-temperature dried, but unfired substrate. Surfactant and defoaming additives are usually charged and mixed with the liquid prior to addition of the remaining solid ingredients. Preferably, the silver flake, sintering adhesive, if any, and anti-settling agent are premixed to obtain a uniform composition prior to charging to the aqueous vehicle. Minor amounts of water and/or co-solvent can be added to adjust the coating composition viscosity to a value within the range from about 0.3 to about 4.0 Pa.s (300 cps–4000 cps). When such adjustments are made it should be borne in mind that addition of water and co-solvent dilutes the concentration of silver flake which reduces the ability to spray the desired thickness of silver onto the substrate in one high speed application. For spray application, the preferable coating composition viscosity will be in the range of about 0.3 to about 1.6 Pa.s (300–1600 cps). The ingredients are mixed with mild agitation until a uniform dispersion is produced.

The coating composition can be sprayed, dipped or applied to the substrate by other traditional methods. Coating compositions of this invention are ideal for spraying. After application, the coating composition is dried which causes the binder to form a film that adheres the silver flake as a metal layer on the substrate. Typically, drying is performed at temperature from ambient to about 200° C., preferably up to about 150° C. Drying continues until most, usually at least about 95%, of the water evaporates. Some of the co-solvent is also removed.

The composition is used to apply a conductive metal layer on an otherwise low- or non-conductive, i.e., resistive or dielectric, surface. It is particularly useful for coating ceramic parts for the electronics industry. To more firmly bind the metal layer, these parts are fired at high temperature, normally from about 600° C. to about 950° C., for sufficient duration to permit the sintering adhesive component of the coating composition to activate. The part is subsequently cooled to allow the sintering adhesive to attach the metal to the ceramic. During firing, polymer binder and residual co-solvent will evaporate and/or pyrolyze. Components of the coating composition of this invention are selected so that pyrolysis products do not leave significant amounts of non-conductive residue which might interfere with the electrical properties of the conductive metal layer after firing.

The inventive coating composition can also be applied to resistive or dielectric substrates not intended for firing. For example, it can be coated onto plastic or elastomer parts to allow those parts to be electroplated thereafter. In these applications, the coating composition can be formulated without sintering adhesive and the proportion of polymer binder can be increased to the high end of the inventive range to provide greater green strength.

This invention is now illustrated by examples of certain representative embodiments thereof, wherein all parts, proportions and percentages are by weight unless otherwise indicated. All units of weight and measure not originally obtained in SI units have been converted to SI units. Viscosity of the coating composition is determined using a Brookfield RVT viscometer with No. 3 spindle and rotation at 10 rev./min.

EXAMPLES

Example 1

The vehicle ingredients in the quantities shown in Table I were mixed and agitated to produce an aqueous vehicle. The pH was adjusted to 9.5 by adding small amounts of monoethanolamine. This vehicle was charged to a 3.8 L ceramic jar to which 50 volume %, 1.25 cm diameter×1.25 cm high burundum cylinders were added. Solids ingredients in the quantities shown in Table I were then added to the jar. The contents of the jar were ball milled overnight to produce a coating composition.

After standing two days, the coating composition was gently rolled in a container for 15 minutes to redisperse solids which had settled. Brookfield viscosity was measured to be 1.55 Pa.s (1550 cps), which is considered acceptable for use with a pressure fed type spray gun. This coating composition was slightly thinned by adding about 2–5 wt % water in order to reduce the viscosity to about 0.5–0.6 Pa.s (500–600 cps) which is suitable for a siphon fed type spray gun.

The 1.55 Pa.s viscosity coating composition was sprayed with a pressure fed spray gun in a single pass onto small ceramic bodies of barium titanate and neodymium titanate. The wet-coated bodies were forced-air dried at 150° C. for 10 minutes. The low temperature dried bodies were fired on a belt furnace with a temperature profile that peaked at 875° C. for 10 minutes. Total furnace cycle time was 50 minutes. The thickness of silver on the fired bodies was 14.8±0.94 μm. Adhesion was tested by soldering a flathead pin onto the surface using a 63 Sn/37 Pb solder. The solder was held in the molten state for 2 minutes before cooling. The force necessary to pull the pin from the body was greater than 20 pounds. A 600 square serpentine pattern of coating composition was printed on a 0.025 μm×2.5 cm×5.3 cm sheet of alumina and fired. Sheet resistivity of less than 2 milliohms/square/25.4 μm was measured.

Example 2

A coating composition as shown in Table 2 was prepared as described in Example 1. This composition was designed for lower viscosity for better spray performance and increased polymer binder content to obtain high green strength. Viscosity of the coating composition was 1.35 Pa.s (1350 cps). The coating composition was sprayed with a pressure fed spray gun onto a small ceramic body which was then dried in air at 150° C. A strip of clear pressure sensitive adhesive tape was stuck to, then peeled from, the coated surface. Little silver flake was observed on the peeled tape, indicating that the surface coating had good green strength.

Example 3

A dipping ink coating composition with the recipe of Table 3 was prepared as described in Example 1. Viscosity of the coating composition was 2.9 Pa.s (2900 cps). Small ceramic bodies were readily dip coated by slow manual immersion into and withdrawal from a bath of the ink. The coated bodies were dried and fired as in Example 1 to achieve a coating thickness of 27.9 μm±3.8 μm and similar adhesion and resistivity as observed in that example were obtained.

Comparative Examples 4–9

Coating compositions listed in Table 4 were prepared according to the procedure of Example 1. Each composition contained 0.3 wt % fumed silica, 0.12 wt % $Cu_2O$, 0.24 wt % CdO and 0.33 wt % lead-borosilicate glass frit. As each composition was transferred from the milling jar to a storage container, it was examined by visual inspection, the results of which are summarized in the table.

Comparative Examples 4 and 5 each employed a non-water soluble acrylic polymer binder. The silver was not well dispersed and it agglomerated. Additionally, an excess of co-solvent was incorporated in the composition of Comparative Example 4.

Poor dispersion observed in Comparative Example 6 is attributed to excessive polymer binder and co-solvent. Significant air entrainment was caused by the lack of surfactants and defoamers in the formulation.

Silver powder was used in Comparative Example 7. The coating composition viscosity was greater than about 10 Pa.s (10,000 cps), and therefore, generally too high for spraying. The sample was stored for a while without agitation, which caused the solids to settle. Vigorous stirring with a spatula failed to redisperse the solids.

The silver flake used in Comparative Example 8 had large particle sizes. Some flake particles were bigger than 20 μm. A coating composition suitable for spraying was not obtained.

In Comparative Example 9, it is believed that the lubricant on the silver flake was not a fatty acid. The silver did not disperse well enough in the vehicle to produce a viable coating composition.

TABLE 1

| grams | wt % | Description Vehicle | grams | wt % | Description Solids |
|---|---|---|---|---|---|
| 122.5* | 2.00 | Acrysol ® I-2426 | 2190 | 73.0 | Silver flake |
| 546.1 | | deionized water | 9.0 | 0.30 | Aerosil ® 300 fumed silica |
| 12.6 | 0.42 | monoethanolamine | 3.6 | 0.12 | $Cu_2O$ |
| 78.0 | 2.60 | diethyleneglycol monobutylether | 7.2 | 0.24 | CdO |
| 4.8 | 0.16 | Surfynol ® 104 | 9.9 | 0.33 | lead borosilicate glass frit** |
| 4.8 | 0.16 | BYK ® -020 | | | |
| 11.1 | 0.37 | Darvan ® C - No. 7 | | | |

*Weight of emulsion containing 49 wt % solids.
**Softening point 546° C.

TABLE 2

| grams | wt % | Description Vehicle | grams | wt % | Description Solids |
|---|---|---|---|---|---|
| 174.9* | 3.00 | Acrysol ® I-62 | 2190 | 73.0 | Silver flake |
| 470.2 | | deionized water | 9.0 | 0.30 | Aerosil ® 300 fumed silica |
| 14.0 | 0.47 | monoethanolamine | 3.6 | 0.12 | $Cu_2O$ |
| 90.2 | 3.0 | diethyleneglycol monobutylether | 7.2 | 0.24 | CdO |
| 6.1 | 0.20 | Surfynol ® 104 | 9.9 | 0.33 | lead borosilicate glass frit** |
| 6.1 | 0.20 | BYK ® -020 | | | |
| 13.9 | 0.36 | Darvan ® C - No. 7 | | | |

*Weight of emulsion containing 49 wt % solids.
**Softening point 546° C.

TABLE 3

| grams | wt % | Description Vehicle | grams | wt % | Description Solids |
|---|---|---|---|---|---|
| 75.6* | 1.26 | Acrysol ® I-62 | 2130 | 71.0 | Silver flake |
| 57.5** | 0.94 | Acrysol ® I-2426 | 12.0 | 0.40 | Aerosil ® 300 fumed silica |
| 497.2 | | deionized water | 3.6 | 0.12 | $Cu_2O$ |
| 11.8 | 0.40 | monoethanolamine | 7.2 | 0.24 | CdO |
| 174.3 | 5.81 | diethyleneglycol monobutylether | 9.9 | 0.33 | lead borosilicate glass frit*** |
| 4.8 | 0.16 | Surfynol ® 104 | | | |
| 4.8 | 0.16 | BYK ® -020 | | | |
| 11.0 | 0.37 | Darvan ® C - No. 7 | | | |

*Weight of emulsion containing 50 wt % solids.
**Weight of emulsion containing 49 wt % solids
***Softening point 546° C.

TABLE 4

| | Silver | | Polymer binder | | Co-solvent | | Surfactant[7] | |
|---|---|---|---|---|---|---|---|---|
| | wt % | Type | wt % | Type | wt % | Type | wt %/wt %/wt % | Results |
| Comp. Ex. 4 | 60 | HCF-38[1] | 2.3 | Rhoplex ® WL-81[5] | 13 | 2-butoxy-ethanol | 0.16/0.16/0.37 | Poor dispersion; agglomerated |
| Comp. Ex. 5 | 65 | HCF-38 | 2.5 | Joncryl ® - 1535[6] | 3.4 | DEGMBE[8] | 0.16/0.16/0.37 | Poor dispersion; agglomerated |
| Comp. Ex. 6 | 60 | HCF-38 | 4.6 | Acrysol ® I-2426 | 10 | 2-butoxy-ethanol | 0/0/0 | Poor dispersion with air bubbles |
| Comp. Ex. 7 | 61 | HCP-3701 Powder[2] | 2.0 | Acrysol ® I-2426 | 5.3 | 2-butoxy-ethanol | 0.16/0.16/0.37 | Viscosity too high; settled solids did not redisperse |
| Comp. Ex. 8 | 73 | Metz #4[3] | 2.0 | Acrysol ® I-2426 | 2.6 | DEGMBE | 0.16/0.16/0.37 | Poorly wet silver with foam |
| Comp. Ex. 9 | 73 | Metz #10E[4] | 2.0 | Acrysol ® I-2426 | 2.6 | DEGMBE | 0.16/0.16/0.37 | Silver flake incompatible with vehicle |

[1]unsaponified, acidic-coated Heraeus Cermalloy flake
[2]Heraeus Cermalloy powder
[3]coarse flake lubricated with saturated fatty acid; 0.7–1.1 $m^2/g$; 2.8–3.2 $g/cm^3$ tap density
[4]flake lubricated with non-fatty acid lubricant; 0.8–1.0 $m^2/g$; 2.3–2.7 $g/cm^3$ tap density
[5]Rohm and Haas high molecular weight, low acid no. = 49, 41.5 wt % solids, preneutralized acrylic latex
[6]S. C. Johnson Co., preneutralized, styrene/acrylic copolymer emulsion with wax additive.
[7]Surfynol ® 104/BYK ® -020/Darvan ® C - No. 7
[8]diethyleneglycol monobutylether

What is claimed is:

1. A coating composition consisting essentially of:
   (a) about 30 to about 80 wt % silver flake coated with a lubricant comprising at least one straight-chain carboxylic acid or salt of said acid, said lubricant having from 6 to 18 carbon atoms;
   (b) about 1.5 to about 4.0 wt % substantially completely water soluble polymer binder;
   (c) about 0.5 to about 8.0 wt % substantially completely water soluble co-solvent; and
   (d) a solvent effective amount of water;
   wherein said percentages are based on total weight of the coating composition.

2. The coating composition of claim 1 wherein the silver flake is in a form of lamellar particles having a long dimension of at most about 15 μm.

3. The coating composition of claim 2 wherein the polymer binder is aqueous emulsion polymer selected from the group consisting of acrylic polymer and acrylic copolymer.

4. The coating composition of claim 3 wherein the silver flake is present from about 60 to about 75 wt %.

5. The coating composition of claim 4 wherein said aqueous emulsion polymer has an average molecular weight from about 5,000 to about 80,000; acid number of at least 60 mg KOH/g polymer and glass transition temperature from about −10° C. to about 80° C.

6. The coating composition of claim 5 including an effective amount of a neutralizing agent selected from the group consisting of alkali and amine to neutralize the coating composition to a pH of about 7 to about 12.

7. The coating composition of claim 6 wherein the coating composition is neutralized to a pH of about 8 to about 10.

8. The coating composition of claim 6 wherein the neutralizing agent is selected from the group consisting of ammonium hydroxide; sodium hydroxide; potassium hydroxide; monoethanolamine; dimethylaminoethanol and morpholine.

9. The coating composition of claim of claim 8 wherein the neutralizing agent is monoethanolamine.

10. The coating composition of claim 9 wherein the polymer binder has an average molecular weight from about 15,000 to about 60,000 and a glass transition temperature from about 25° C. to about 60° C.

11. The coating composition of claim 4 wherein the co-solvent is selected from the group consisting of aliphatic alcohols, ethylene and propylene oligomer glycols, ethers and esters of said alcohols and glycols, and mixtures of said alcohols, glycols, ethers and esters; and wherein said co-solvent has 6 to 18 carbon atoms.

12. The coating composition of claim 11 wherein the co-solvent is selected from the group consisting of diethyleneglycol monoethylether; diethyleneglycol monobutylether; 2-butoxyethanol and a mixture of them.

13. The coating composition of claim 12 wherein the co-solvent is diethyleneglycol monobutylether.

14. The coating composition of claim 9 wherein the co-solvent is selected from the group consisting of aliphatic alcohols, ethylene and propylene oligomer glycols, ethers and esters of said alcohols and glycols, and mixtures of said alcohols, glycols, ethers and esters; and wherein said co-solvent has 6 to 18 carbon atoms.

15. The coating composition of claim 14 wherein the co-solvent is selected from the group consisting of diethyleneglycol monoethylether; diethyleneglycol monobutylether; 2-butoxyethanol and a mixture of them.

16. The coating composition of claim 2 further comprising about 0.1 to about 2.0 wt % of a sintering adhesive component.

17. The coating composition of claim of claim 16 wherein the sintering adhesive component includes at least one of cupric oxide, cadmium oxide, zinc oxide, barium oxide, manganese oxide, aluminum oxide, silicon dioxide, lead-borosilicate glass frit and barium-borosilicate glass frit.

18. A coating composition consisting essentially of
(a) about 60 to about 75 wt % silver flake coated with a lubricant comprising at least one straight-chain carboxylic acid or salt of said acid, said lubricant having from 6 to 18 carbon atoms, wherein said silver flake is in a form of lamellar particles having a long dimension of at most about 15 μm;
(b) about 1.5 to about 4.0 wt % water soluble polymer binder;
(c) about 0.5 to about 8.0 wt % substantially completely water soluble co-solvent;
(d) about 0.3 to about 6.0 wt % of at least one surfactant and defoamer additive;
(e) about 0.1 to about 5.0 wt % anti-settling agent;
(f) about 0.1 to about 2.0 wt % sintering adhesive component; and
(g) a complementary amount of water to total 100 wt %;
wherein the amounts of (c) and (g) are in proportion such that viscosity of the coating composition is from about 0.3 to about 4.0 Pa.s.

19. The coating composition of claim 18 wherein said polymer binder is aqueous emulsion polymer selected from the group consisting of acrylic polymer and acrylic copolymer; said aqueous emulsion polymer having an average molecular weight from about 5,000 to about 80,000; acid number of at least 60 mg KOH/g polymer and glass transition temperature from about −10° C. to about 80° C.;
wherein the co-solvent is selected from the group consisting of aliphatic alcohols, ethylene and propylene oligomer glycols, ethers and esters of said alcohols and glycols, and mixtures of said alcohols, glycols, ethers and esters; and wherein said co-solvent has 6 to 18 carbon atoms;
wherein said surfactant and defoamer additive consists essentially of:
(i) about 0.1 to about 1.6 wt % polyelectrolyte ammonium salt;
(ii) about 0.1 to about 0.8 wt % 2,4,7,9-tetramethyl-5-decyn-4,7-diol; and
(iii) about 0.1 to about 0.8 wt % polysiloxane copolymer defoamer; and
wherein said anti-settling agent is about 0.3 to about 1.0 wt % fumed silica.

20. The coating composition of claim 19 including an effective amount of a neutralizing agent selected from the group consisting of alkali and amine to neutralize the coating composition to a pH of about 7 to about 12; and
wherein said co-solvent is selected from the group consisting of diethylene glycol monobutylether; diethyleneglycol monoethylether; 2-butoxyethanol and a mixture of them.

21. The coating composition of claim 20 wherein the neutralizing agent is selected from the group consisting of ammonium hydroxide; sodium hydroxide; potassium hydroxide; monoethanolamine; dimethylaminoethanol and morpholine;
wherein the co-solvent is diethyleneglycol monobutylether; and
wherein the sintering adhesive component includes at least one of cupric oxide, cadmium oxide, zinc oxide, barium oxide, manganese oxide, aluminum oxide, silicon dioxide, lead-borosilicate glass frit and barium-borosilicate glass frit.

22. A coating composition comprising:
(a) about 30 to about 80 wt % silver flake coated with a lubricant comprising at least one straight-chain carboxylic acid or salt of said acid, said lubricant having from 6 to 18 carbon atoms, wherein the silver flake is in a form of lamellar particles having a long dimension of at most about 15 μm;
(b) about 1.5 to about 4.0 wt % substantially completely water soluble polymer binder;
(c) about 0.5 to about 8.0 wt % substantially completely water soluble co-solvent;
(d) a solvent effective amount of water; and
(e) about 0.1 to about 2.0 wt % of a sintering adhesive component including at least one of cupric oxide, cadmium oxide, zinc oxide, barium oxide, manganese oxide, aluminum oxide, silicon dioxide, lead-borosilicate glass flit and barium-borosilicate glass flit;

23. A coating composition comprising:
(a) about 30 to about 80 wt % silver flake coated with a lubricant comprising at least one straight-chain carboxylic acid or salt of said acid, said lubricant having from 6 to 18 carbon atoms;

(b) about 1.5 to about 4.0 wt % substantially completely water soluble polymer binder;
(c) about 0.5 to about 8.0 wt % diethyleneglycol monobutylether; and
(d) a solvent effective amount of water;
wherein said percentages are based on total weight of the coating composition.

* * * * *